(12) United States Patent
Gelbart

(10) Patent No.: US 6,180,325 B1
(45) Date of Patent: Jan. 30, 2001

(54) METHOD FOR MASKING AND EXPOSING PHOTOSENSITIVE PRINTING PLATES

(75) Inventor: Daniel Gelbart, Burnaby (CA)

(73) Assignee: Creo SRL, Burnaby (CA)

( * ) Notice: Under 35 U.S.C. 154(b), the term of this patent shall be extended for 0 days.

(21) Appl. No.: 09/339,044

(22) Filed: Jun. 23, 1999

(51) Int. Cl.[7] ................................ G03F 7/24; G03F 7/18; G03F 7/36; G03C 5/56; G03C 5/16
(52) U.S. Cl. ............................. 430/397; 430/396; 430/5; 430/935; 430/300; 430/306; 430/273.1; 427/425; 427/510; 427/512; 427/521; 427/385.5
(58) Field of Search ................................ 430/396, 397, 430/5, 273.1, 300, 306, 935; 427/425, 510, 512, 521, 385.5

(56) References Cited

U.S. PATENT DOCUMENTS

| | | | |
|---|---|---|---|
| 5,713,287 | * 2/1998 | Gelbart | 101/467 |
| 5,759,742 | * 6/1998 | West et al. | 430/5 |
| 5,888,697 | * 3/1999 | Fan | 430/273.1 |

* cited by examiner

Primary Examiner—Janet Baxter
Assistant Examiner—Sin J. Lee
(74) Attorney, Agent, or Firm—Oyen Wiggs Green & Mutala

(57) ABSTRACT

A method for exposing photo-sensitive printing plates comprises applying a patterned coating to the printing plate to form a mask. The coating may be sprayed onto the printing plate and patterned by laser ablation. The method avoids the need to stock printing plates with integral masking layers. In preferred implementations the printing plate is exposed to actinic radiation without dismounting it from the apparatus in which the coating is applied. This minimizes the likelihood that the coating could be damaged in handling. The coating may be a thin sprayed on layer of carbon in a suitable binder.

11 Claims, 3 Drawing Sheets

METHOD FOR MASKING AND EXPOSING PHOTOSENSITIVE PRINTING PLATES

TECHNICAL FIELD

This invention relates to printing, more specifically to methods and apparatus for exposing photosensitive flexographic printing plates. The methods and apparatus allow the creation of exposed printing plates without the need to handle a separate mask and without the disadvantages inherent in flexographic printing plates which are supplied with integral masks.

BACKGROUND

Photosensitive flexographic printing plates have a layer of a photo-polymer which undergoes a chemical reaction when exposed to actinic radiation. Typically ultraviolet light is used to expose the photo-polymer in flexographic printing plates. Upon exposure to ultraviolet light the photo-polymer undergoes a cross-linking reaction. The printing plates are exposed through a mask which blocks light from reaching certain portions of the photo-polymer. The mask is patterned with a pattern of opaque and non-opaque areas which form an image to be recreated on the printing plate. After exposure the printing plate can be developed. After development the pattern of exposed and unexposed areas on the printing plate provide a textured surface which may be used to print an image.

Some types of printing plate are used in conjunction with a separate mask. Typically the mask is made from a half-tone film, such as a silver-halide film, which can be placed on top of the plate before the plate is exposed. A problem with this method is that it is necessary to keep the film in intimate contact with and in accurate alignment with the plate during exposure. If the mask is misaligned with the printing plate or if the mask is not kept in intimate contact with the printing plate during exposure then the results obtained will be less then optimum. Even when a separate mask is applied carefully to a printing plate the results obtained are often not optimal.

Another method for exposing flexographic plates involves providing a photosensitive plate which has a mask formed integrally with the plate. Such plates include a layer of a photosensitive material such as a photo-polymer gel underlying a layer of mask material. Because the mask is integral with the printing plate, this approach provides a mask which is always in intimate contact with the photo-polymer layer and which is always properly aligned with the printing plate. A problem with this method is that the material from which the mask layer is made can diffuse into the photo-polymer gel. Over time this can degrade the gel. As a result, printing plates which include an integral mask may have a low shelf life.

The problem of low shelf-life is exacerbated because there are a large number of different types of photo-polymers used in printing plates. All have different characteristics and are used in different applications. If each of the different types of printing plates has a short shelf life then it is often not practical for a user to keep on hand a stock of printing plates of any types which will not be quickly used up.

A further problem with printing plates which have an integral masking layer is that the masking layer on existing plates is typically fragile. A scratch in any portion of the masking layer can make the entire plate unusable.

U.S. Pat. No. 5,262,275 discloses a flexographic printing element which incorporates a barrier layer which separates an infrared ablatable masking layer and a photo-polymerizable layer. The barrier layer prevents migration of material from the masking layer into the photo-polymerizable layer. While this construction improves the shelf life of a printing plate it does not avoid the requirement to maintain a number of different types of printing plate in stock which have different types of photo-polymer layer. It also does not address the problem that the masking layer of a printing plate may become damaged, thereby making the plate unusable.

There is a need for a method for imaging flexographic printing plates which avoids or reduces at least some of the difficulties which are inherent in the above-noted existing technologies.

SUMMARY OF INVENTION

This invention provides methods for exposing photosensitive printing plates which address some of the limitations of the prior art. In a preferred embodiment the method comprises mounting a printing plate to a holder; applying a patterned coating to an outer surface of the printing plate by moving a coating applicator relative to the holder; and, exposing the printing plate through the patterned coating to actinic radiation without removing the printing plate from the holder. The invention permits performing coating and exposure steps in a single apparatus. This avoids handling-induced damage.

Since the plate does not need to be handled between the application of the mask and the exposure to actinic radiation, the mask material can be selected to have excellent optical opacity. It is not necessary to select a mask material which is also capable of withstanding handling. Masks used in systems where plates must be handled before they are exposed must have acceptable shelf-life, scratch-resistance, flexibility (to avoid cracking when a plate is bent around a drum) and more. Selecting a mask material having acceptable handling characteristics could require one to sacrifice optimal optical opacity. Where the mask is not disturbed between application and exposure, as is possible with this invention, the one property of the mask which is the essence of the mask, its optical transmittance characteristics, can be optimized.

The invention also permits the use of printing plates which are supplied and stored in an uncoated form. Such printing plates tend to have longer shelf lives than printing plates which are pre-coated. Further, uncoated printing plates lack delicate coatings which can be damaged during storage.

In preferred embodiments of the invention the holder comprises a rotatable drum and the patterned coating is applied while rotating the drum. The coating may be applied by spraying a coating onto the printing plate.

After the coating has been applied selected portions of the sprayed coating may be removed by laser ablation. In the alternative, the coating may comprise a coating of a thermally sensitive material and patterning the coating may comprise selectively changing an optical transmission of the thermally sensitive material by locally heating the thermally sensitive material with a laser. In the further alternative a patterned coating may be applied by selectively applying an opaque coating to a surface of the printing plate with an ink jet printing head.

It is advantageous to simultaneously apply the coating to some parts of the printing plate, pattern the coating in other parts of the printing plate and expose the coating to actinic radiation in yet other parts of the printing plate. This may be done, for example, by providing a sprayer and a laser and simultaneously moving the sprayer and laser axially along the printing plate with the laser trailing the sprayer.

Another embodiment of the invention provides a method for exposing photosensitive printing plates. The method comprises mounting a printing plate to a rotatable drum, while rotating the drum, applying a patterned coating to an outer surface of the printing plate by providing a coating applicator and moving the coating applicator axially relative to the drum while applying a coating to the surface of the printing plate and moving a coating patterner axially relative to the drum trailing the coating applicator, the coating patterner either selectively removing the applied coating or selectively changing optical properties of the applied coating to create a mask layer on the printing plate. The patterned printing plate may subsequently be exposed to actinic radiation.

Yet another embodiment of the invention provides a method for exposing photosensitive printing plates. The method comprises: providing a printing plate mounted in a holder, the printing plate having a surface coated with a coating; patterning the coating by moving a coating patterner relative to the holder over the coated surface of the printing plate; and, exposing the printing plate through the patterned coating to actinic radiation without removing the printing plate from the holder.

Some of the advantages of the invention can be obtained by performing two or more steps that are conventionally performed in separate apparatus in a single apparatus. Thus, a further embodiment of the invention provides a method for exposing a photosensitive printing plate. The method comprises applying a patterned coating to a photosensitive printing plate and exposing the printing plate to actinic radiation. At least two of the steps of: applying a coating to a surface of the plate; patterning the coating; and, exposing the printing plate through the patterned coating to actinic radiation; are performed in a single apparatus without dismounting the printing plate.

Further advantages and features of the invention are described below.

BRIEF DESCRIPTION OF THE DRAWINGS

In drawings which illustrate non-limiting embodiments of the invention.

DESCRIPTION

Figure 1:
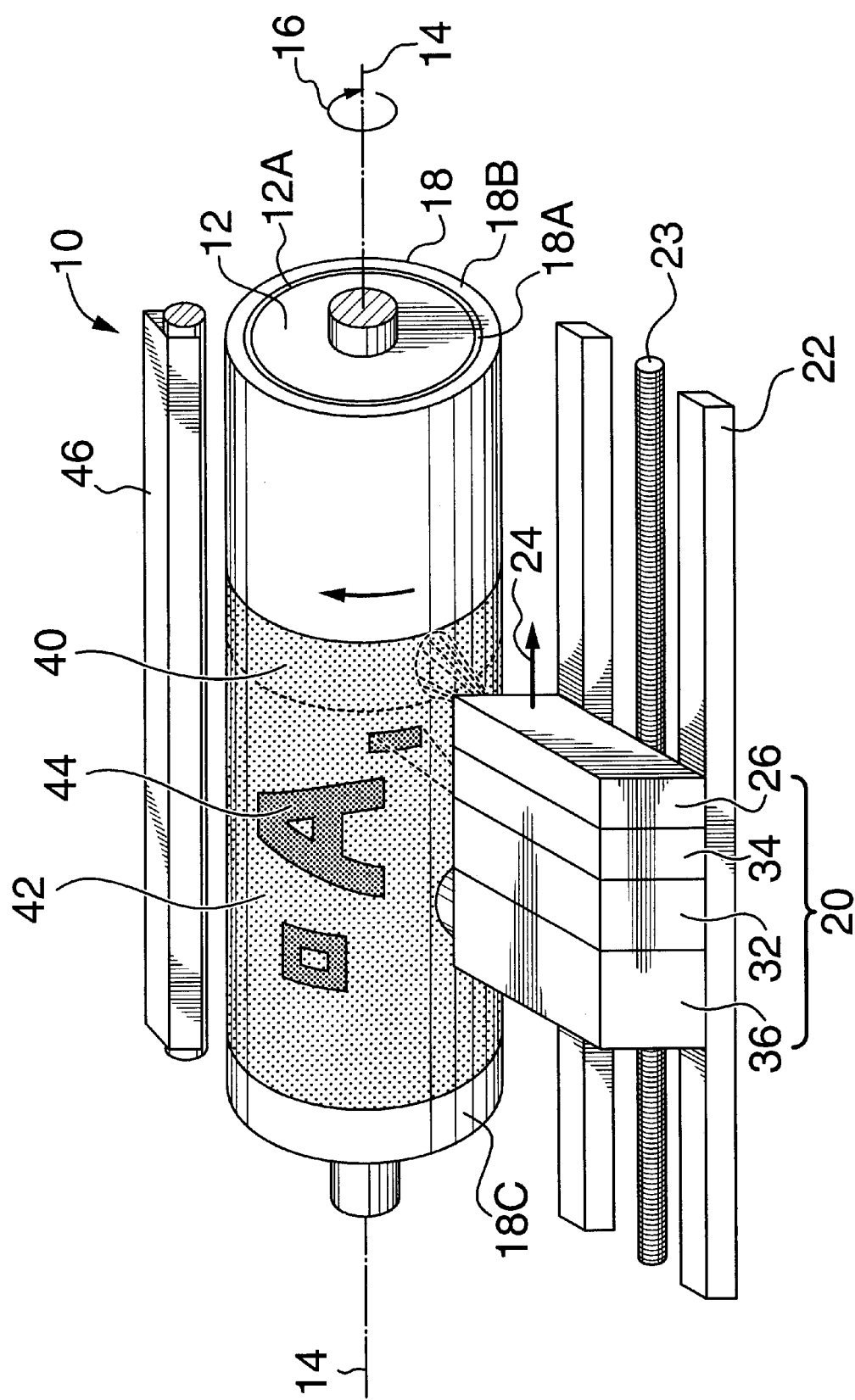
FIG. 1 is a perspective partially schematic view of apparatus for practising the invention.

FIG. 1 shows apparatus 10 which may be used to practise the invention. Apparatus 10 includes a drum 12 which is mounted for rotation about an axis 14 as indicated by arrow 16. A photo-sensitive printing plate 18 is mounted on an outer surface 12A of drum 12. In the illustrated embodiment, printing plate 18 is provided in the form of a seamless sleeve having a substrate, or base layer, 18A which fits snugly onto drum 12 and a photo-polymerizable layer 18B. Photopolymerizable layer 18B is initially not covered by any masking layer. If plate 18 is not a sleeve which extends around the circumference of drum 12 then plate 18 is held onto drum 12 using any suitable means. Suitable means may include vacuum and/or mechanical clamps (not shown).

A head 20 comprising a coating unit 26 is mounted so that it can be moved parallel to axis 14. In the illustrated embodiment, head 20 is slidably mounted on tracks 22. A screw 23 drives linear motion of head 20 parallel to axis 14 as indicated by arrow 24.

As drum 12 revolves, coating unit 26 traverses across exposed face 18C of printing plate 18 and, as it does so, deposits a coating 40 on surface 18C. Preferably coating 40 is an opaque black coating. For example, coating 40 may consist of a mixture of carbon black in a suitable binder. The binder may comprise a suitable polymer, hydrocarbon, wax oxidizing agent (to increase sensitivity) etc.

Figure 2:
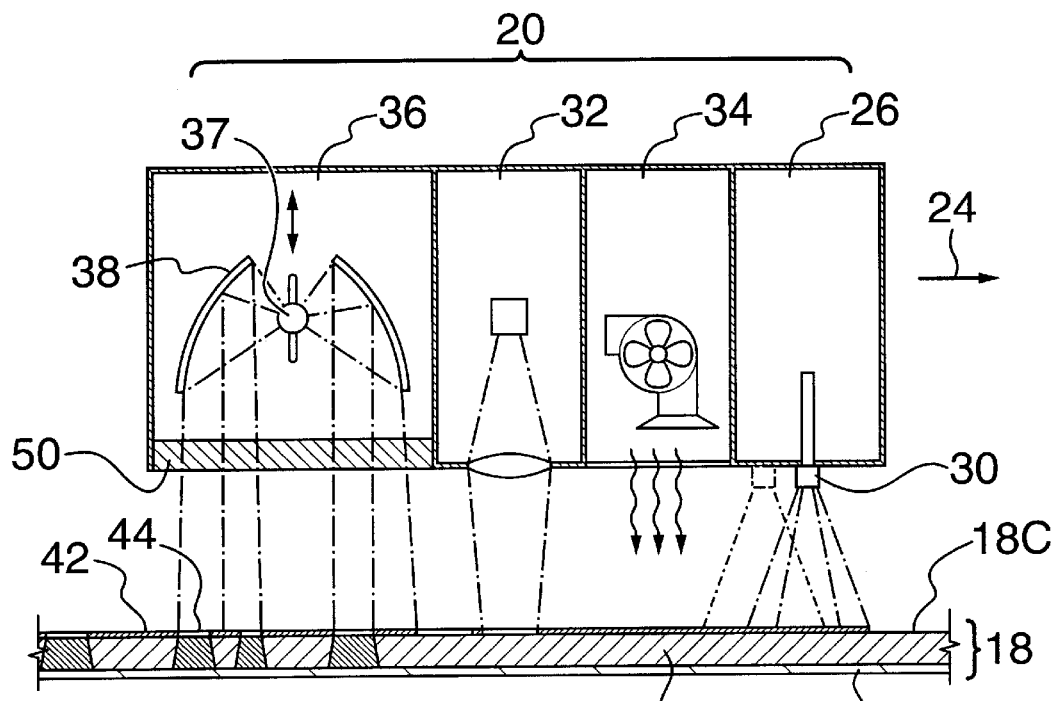
FIG. 2 is a top plan view of a travelling head portion of the apparatus of FIG. 1.

Referring now to FIGS. 1 and 2, coating unit 26 produces in coating 40 a pattern of first areas 42 which are opaque to actinic radiation and second areas 44 which are non-opaque to actinic radiation. Coating unit 26 receives a digital control signal which specifies the locations of areas 42 and 44.

In a preferred embodiment of the invention, coating unit 26 includes a coating applicator 30 which applies a masking film to surface 18C and a coating patterner 32 which either removes or changes the optical characteristics of the masking film to yield patterned first and second areas 42 and 44.

Coating applicator 30 of coating unit 26 is preferably a spray gun. Where first component 30 applies an ablatable coating 40 to surface 18C then coating patterner 32 may be a laser, or an array of lasers, capable of selectively removing coating 40 from areas 44 of surface 18C by ablation. Coating unit 26 switches each laser on when the control signal indicates that the laser's beam is directed at a point within an area 44.

In the alternative, coating 40 may be a coating which has optical characteristics which may be selectively altered by exposure to, for example, laser irradiation. In this embodiment of the invention, coating 40 may be, for example, a thermally alterable coating such as the Thermal Dry Silver product which is sold by the 3M company of Minneapolis Minn. In this embodiment of the invention, coating patterner 32 may also comprise a laser capable of selectively heating coating 40 to change its optical properties. The thermal dry silver material referred to above is initially transparent to ultraviolet radiation but becomes opaque to ultraviolet radiation upon heating.

In the further alternative, instead of applying a uniform coating 40 to surface 18C, coating unit 26 may instead selectively apply a coating only to certain areas of surface 18C. This may be accomplished, for example, by providing a coating unit 26 in the form of a ink jet printing head. An ink jet printing head is capable of ejecting dots of ink or other opaque material onto surface 18C to produce a coating 40. Ink jet technology is widely understood and will therefore not be described here. When an ink jet printing head is used to selectively apply coating to plate 18 there is no need for separate coating application and coating patterning steps and no separate coating patterner 32 is required.

A dryer 34 may optionally be provided on head 20 to dry coating 40 after it is applied. Dryer 34 may, for example, comprise a simple fan or a nozzle connected to a source of compressed air. Drier 34 may comprise a heater.

Coating applicator 30 may include a plurality of nozzles. This is particularly useful where coating 40 is the reaction product of two separate ingredients. For example, the thermal dry silver coating referred to above is the result of a reaction between two different component mixtures. Coating applicator 30 may comprise two nozzles, one nozzle applying each component of the coating 40, the two components combining on surface 18C, or in transit to surface 18C, to form coating 40.

Preferably photo-sensitive layer 18B is exposed to actinic radiation through the mask formed by coating 40 before plate 18 is removed from roller 12. This avoids the possibility of any damage to coating 40 which may be caused by handling as plate 18 is removed from drum 12. After plate 18 has been exposed to actinic radiation coating 40 is no longer required and damage to coating 40 is irrelevant.

Exposure of photo-sensitive layer 18B is preferably provided by a suitable light source 36, such as an ultra-violet lamp. Light source 36 is preferably mounted to head 20.

A cleaning unit known in the printing industry as a "blanket cleaner" 46 is preferably provided to remove over spray from the surface of drum 12 after plate 18 has been removed from drum 12. Suitable blanket cleaners are well known in the industry. One type of blanket cleaner which may be used to clean roller 12 is the IMPACT™ automatic blanket cleaning system available from Baldwin Technology Company, Inc. of Norwalk Conn. The same cleaner may be used to remove coating 40 from plate 18 before plate 18 is removed from drum 12. This eliminates the necessity of removing coating 40 as part of processing plate 18. As an alternative to a blanket cleaner a high pressure water jet (not shown) may be used to remove coating 40. The use of water jets for cleaning is well known and has the additional advantage that the water jet spray head can follow the illuminator 36 and remove, in the same pass as the exposure, all of coating 40 from plate 18 and drum 12. The water jet spray head may be mounted to head 20.

In practising the invention, the spray from coating applicator 30 and the illumination from illuminator 36 should have a width which is significantly greater, i.e., at least 2 times greater, than the distance which head 20 moves in direction 24 in each revolution of drum 12. Thus, each portion of plate 18 will have applied to a coating 40 made up of many light coats. Each section of plate 18 will also be exposed to light from illuminator 36 on many revolutions of drum 12. For example, applicator 30 may apply a spray of coating 40 having a width of approximately 50 mm, laser array 32 may expose a strip of plate 18 approximately 2 mm wide, and light source 36 may illuminate a section of plate 18 approximately 200 mm wide. If head 20 is moved 2 mm in direction 24 for each revolution of drum 12 then each portion of plate 18 would receive a layer of coating 40 made up of approximately 25 coats of material sprayed on by coating applicator 30 and each point on the surface of drum 12 would be illuminated by light source 36 in each of approximately 100 revolutions of drum 12.

Figure 3A:
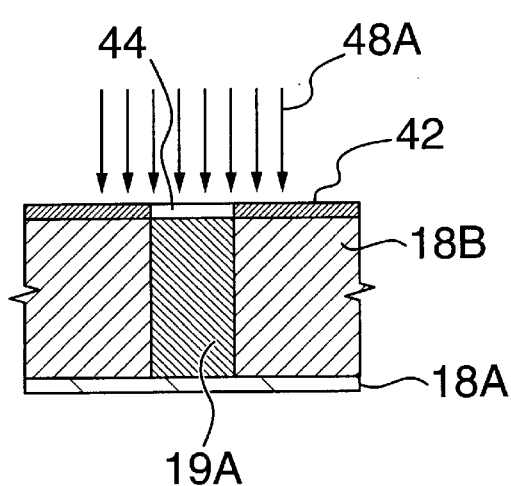
FIG. 3 is a section through an exposed printing plate according to the invention illustrating the effect of varying the degree of collimation of light used in exposing the printing plate; and, FIG. 4 is a flowchart illustrating a method of the invention.
Figure 3B:
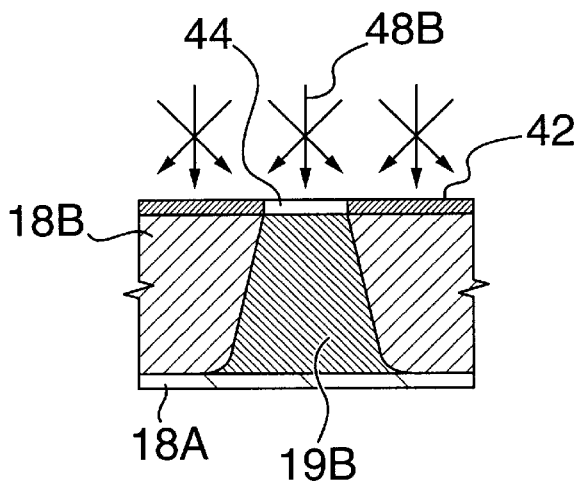

It is preferable to provide a light source 36 which has a variable collimation. FIGS. 3A and 3B are cross-sectional views through sections of a printing plate 18 coated with an opaque masking layer 40. In FIG. 3A, exposure of photo-polymer layer 18 is made with highly collimated light 48A. It can be seen that the light enters photo-polymer layer 18B through an area 44 in masking layer 40 and causes polymerization of a region 19A within polymer layer 18B. Because light 48A is highly collimated, the light tends not to spread out as it passes through photo-polymer layer 18B. The result is a feature in photo-polymer layer 18B which has relatively steep sides. FIG. 3B shows a situation in which light source 36 is adjusted so that the light 48B incident on mask layer 40 is not highly collimated. Because light 48B is not highly collimated, it tends to spread out in photo-polymer layer 18B after passing through transparent areas 44. The result is that photo-polymer layer 18B is polymerized in a region 19B which has sides which slope more gradually than the sides of region 19A.

As shown in FIG. 2, where light source 36 comprises a lamp 37 and a reflector 38, the collimation may be adjusted by changing the relative positions of lamp 37 and reflector 38. Light source 36 is preferably a metal halide or mercury arc lamp. Light source 36 may, for example, comprise a ELC4000 400 watt modular light curing system available from the Electro-lite Corporation of Danbury, Conn. Light source 36 could comprise multiple ultraviolet lamps to increase the ultraviolet exposure if necessary.

Preferably light source 36 includes a filter which prevents undue heating of plate 18 or coating 40. For example, a dichroic filter 50 which passes only UV radiation may be provided in front of light source 36. Typically it is desirable to set the collimation of light source 36 so that the features produces in photo-polymer layer 18B have a desirable profile. In general the degree of collimation which is desired will depend upon the thickness of photo-polymer layer 18B as is known in the art. Suitable shields, not shown, may be provided to prevent exposure of uncoated parts of photo-polymer layer 18B by light source 36.

Printing plates may comprise many different kinds of photosensitive materials. Some such materials react differently to actinic radiation when they have a surface which is exposed to air than they do when they are not in contact with the air. Where the photosensitive material is a photo-polymer, the presence of air can affect the progress of the polymerization reaction. Therefore, a coating 40, such as carbon black, which is completely removed in areas 44 may produce somewhat different results than a coating 40 in which the optical characteristics are modified in areas 44 but coating 40 remains present and shields photo-polymer layer 18B from contact with air during exposure to actinic radiation from light source 36.

In typical applications of the invention, the rate at which coating 40 can be patterned on surface 18C limits the rate at which the method of the invention may be practised. With currently available technology it is generally possible to both apply coating 40 quickly enough and to expose photo-polymer 18B quickly enough to keep up with the rate at which coating 40 is patterned by coating unit 26.

After head 20 has completely traversed plate 18 so that every portion of 18 has been coated with coating 40, coating 40 has been patterned, and photo-sensitive layer 18B has been exposed to actinic radiation, then plate 18 may be processed by washing off layer 40 together with any uncured parts of photo-polymer layer 18B. The processing of plate 18 and subsequent steps in the use of plate 18 for printing may be done by conventional means which are understood in the art and which are beyond the scope of this invention.

Figure 4:
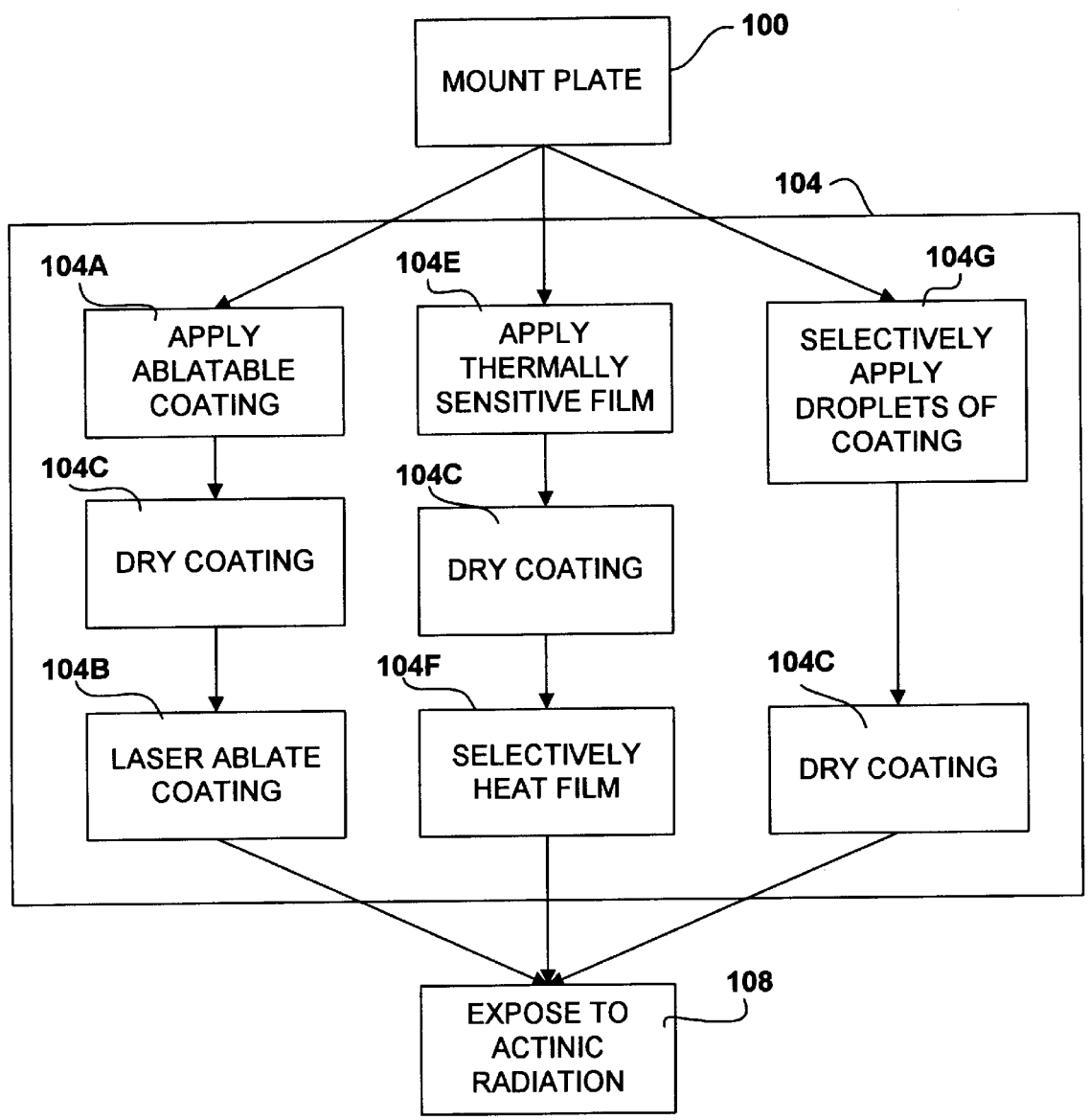

FIG. 4 illustrates steps in the method according to one embodiment of the invention. The method begins by providing a printing plate mounted to a rotatable drum (step 100). As the drum is rotated, a patterned coating is applied to the surface of the printing plate (step 104). The step of applying the patterned coating to the surface of the printing plate preferably comprises applying an ablatable coating to the surface of the printing plate (step 104A) and selectively removing the ablatable coating from portions of the printing plate surface by laser ablation (step 104B). According to an alternative embodiment of the invention, the step of applying the patterned coating is practised by applying a thermally sensitive film to the surface of the printing plate (step 104E) and subsequently altering optical characteristics of the thermally sensitive film by selectively locally heating the applied thermally sensitive film with a laser (step 104F). In a further alternative embodiment of the invention, the step of applying a patterned film to the surface of the plate is practised by selectively applying droplets of coating material to areas in which the coating is desired to be opaque by way of an ink jet type coating applicator (step 104G) and not applying any coating material to other areas.

The step of applying the patterned coating optionally includes drying the coating by, for example, a stream of fan forced or compressed air or another gas (step 104C).

After the patterned coating has been applied to the printing plate then the printing plate is exposed to actinic radiation through the mask formed by the patterned coating (step 108). In all preferred embodiments of the invention this is carried out without dismounting the plate from the drum. Preferably the steps of applying the patterned coating and exposing the printing plate are carried out simultaneously on different parts of the printing plate.

After the printing plate has been exposed then the patterned coating and any non-cured photo-polymer from the printing plate may be removed, for example, by washing. Further subsequent processing steps, as are well known in the art, may be used to complete the preparation of the printing plate for use in printing.

It can be appreciated that one advantage of the invention is that use of the invention avoids many disadvantages of printing plates having integral mask layers and also avoids the problems inherent in providing and aligning a separate mask layer.

EXAMPLE 1

A coating material consisting of a mixture of 20% carbon black, 10% binding agent (PVA) and 70% water was sprayed onto the surface of a printing plate mounted to a drum as the drum was rotated at an angular speed of 12 r.p.m. The coating was dried. After drying the coating had a thickness of approximately 3 microns. A 240 channel thermal head manufactured by Creo Products Inc. of Burnaby, British Columbia, Canada with a power of 0.1 watts per channel and a spot size of approximately 10 microns was used to selectively ablate the coating. The sensitivity was approximately 5 J/cm$^2$. This permitted the imaging of approximately 4.8 cm$^2$sec. The printing plate was then exposed through the imaged coating to ultraviolet radiation provided by a model ELC-4000 400 watt metal halide ultraviolet lamp available from Electro-lite Corporation of Danbury, Conn. After the plate was removed from the drum a Baldwin IMPACT commercial blanket cleaner was used to clean the drum.

EXAMPLE 2

A thermal dry silver coating was applied to the surface of a printing plate. The thermal dry silver coating is approximately 5 times more sensitive to infrared radiation than ablation, requiring approximately 1 joule per centimeter squared for imaging.

As will be apparent to those skilled in the art in the light of the foregoing disclosure, many alterations and modifications are possible in the practice of this invention without departing from the spirit or scope thereof. For example, the invention, as described above, provides that light source 36 is mounted to and travels as part of the same head 20 which includes coating applicator 26. It would be possible to practise the invention by mounting the various individual components of head 20, which are described above, on two or more separate actuators so that each component could be moved across surface 18C of plate 18 in a coordinated fashion.

While coating unit 26 has been described as comprising a sprayer having one or more nozzles or an ink jet device, coating unit 26 could roll-on, or otherwise apply, a suitable coating 40.

While light source 36 has been described as being moved together with head 20 light source 36 could be a stationary light source. If so then coating 40 could be applied to the entire surface 18C and light source 36 could be used subsequently to expose printing plate 18.

While it is preferable to apply a patterned coating to printing plate 18 and to expose printing plate 18 without dismounting printing plate 18, some benefits of the invention could be achieved by spraying a coating 40 onto plate 18 and patterning the coating by either ablation, if coating 40 is an abatable coating, or changing the optical properties of coating 40 if coating 40 is a thermal film, as described above. Printing plate 18 could then be dismounted and exposed to actinic radiation in a separate device.

While the above description achieves relative motion between printing plate 18 and head 20 by mounting plate 18 on a rotating drum 12, relative motion between head 20 and plate 18 could also be achieved by scanning head 20 in a two dimensional pattern over plate 18.

Accordingly, the scope of the invention is to be construed in accordance with the substance defined by the following claims.

What is claimed is:

1. A method for exposing photosensitive printing plates, the method comprising:
    a) mounting a printing plate to a holder comprising a rotatable drum;
    b) applying a patterned coating to an outer surface of the printing plate while rotating the drum by moving the coating applicator axially relative to the drum while applying a coating to the surface of the printing plate; and,
    c) exposing the printing plate through the patterned coating to actinic radiation without removing the printing plate from the holder
wherein the coating applicator comprises a sprayer and applying the coating comprises spraying a coating material from the sprayer in a spray pattern having a width at least 2 times greater than an axial distance moved by the coating applicator in one revolution of the drum.

2. The method of claim 1 wherein applying a patterned coating comprises removing selected portions of the sprayed coating by laser ablation.

3. The method of claim 2 wherein applying a patterned coating comprises directing a stream of gas at the sprayed coating to dry the sprayed coating before removing selected portions of the sprayed coating.

4. The method of claim 2 wherein applying the patterned coating comprises providing a sprayer and a laser and simultaneously moving the sprayer and laser axially along the printing plate with the laser trailing the sprayer.

5. The method of claim 1 wherein applying the patterned coating comprises applying a coating of a thermally sensitive material to a surface of the printing plate and selectively changing an optical transmission of the thermally sensitive material by locally heating the thermally sensitive material with a laser.

6. The method of claim 5 herein the thermally sensitive material comprises a coating formed by the reaction of two components and the method comprises spraying each of the two components onto the printing plate.

7. The method of claim 1 wherein exposing the printing plate to actinic radiation comprises providing a light source and moving the light source axially relative to the drum together with, and trailing, the coating applicator while allowing the light source to illuminate the printing plate through the applied patterned coating.

8. The method of claim 7 wherein the light source has a variable collimation.

9. The method of claim 1 wherein the printing plate comprises a sleeve.

10. A method for exposing photosensitive printing plates, the method comprising:

a) mounting a printing plate to a holder;

b) applying a patterned coating to an outer surface of the printing plate by moving a coating applicator relative to the holder; and, c) exposing the printing plate through the patterned coating to actinic radiation without removing the printing plate from the holder wherein applying the patterned coating comprises applying a coating of a thermally sensitive material to a surface of the printing plate and selectively changing an optical transmission of the thermally sensitive material by locally heating the thermally sensitive material with a laser and wherein the thermally sensitive material comprises a coating formed by the reaction of two components and the method comprises spraying each of the two components onto the printing plate.

11. The method of claim 10 wherein the printing plate comprises a sleeve.

* * * * *